(12) United States Patent
Wong et al.

(10) Patent No.: US 8,369,976 B2
(45) Date of Patent: Feb. 5, 2013

(54) METHOD FOR COMPENSATING FOR TOOL PROCESSING VARIATION IN THE ROUTING OF WAFERS/LOTS

(75) Inventors: Keith Kwong Hon Wong, Wappingers Falls, NY (US); Xu Ouyang, Hopewell Junction, NY (US); Yunsheng Song, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 756 days.

(21) Appl. No.: 12/144,093

(22) Filed: Jun. 23, 2008

(65) Prior Publication Data

US 2009/0319074 A1 Dec. 24, 2009

(51) Int. Cl.
*G06F 19/00* (2011.01)
(52) U.S. Cl. ............ 700/112; 700/121; 438/17; 438/14; 451/57
(58) Field of Classification Search .................. 700/112, 700/121; 438/17, 14; 451/57
See application file for complete search history.

(56) References Cited

U.S. PATENT DOCUMENTS

| | | | |
|---|---|---|---|
| 6,586,265 B2 | 7/2003 | Chiou et al. | |
| 6,929,962 B1 | 8/2005 | Chang | |
| 7,062,411 B2 | 6/2006 | Hopkins et al. | |
| 7,177,716 B2 | 2/2007 | Duffin et al. | |
| 7,318,206 B2 | 1/2008 | Brendler et al. | |
| 2003/0180972 A1* | 9/2003 | Al-Bayati et al. | 438/14 |
| 2004/0083021 A1* | 4/2004 | Somekh et al. | 700/121 |
| 2005/0075056 A1* | 4/2005 | Wu et al. | 451/57 |
| 2009/0035883 A1* | 2/2009 | Wang et al. | 438/17 |

* cited by examiner

*Primary Examiner* — Tejal Gami
(74) *Attorney, Agent, or Firm* — Ian D. MacKinnon; Roberts Mlotkowski Safran & Cole, P.C.

(57) ABSTRACT

A method for increasing overall yield in semiconductor manufacturing including routing wafers or wafer lots from tool to tool in a manner which at least partially neutralizes or compensates for processing variations. A system for increasing overall yield in semiconductor manufacturing includes a module for recording processing data from plural first and second types of tools and a module for routing wafers or wafer lots from tools of the first type of tools to tools of the second type of tools so as to at least partially neutralizes or compensate for processing variation.

16 Claims, 11 Drawing Sheets

US 8,369,976 B2

METHOD FOR COMPENSATING FOR TOOL PROCESSING VARIATION IN THE ROUTING OF WAFERS/LOTS

FIELD OF THE INVENTION

The invention generally relates to a system and method for increasing overall yield in semiconductor manufacturing by automatically routing the wafers in a manner which neutralizes or compensates for tool processing variations.

BACKGROUND

Semiconductor manufacturing facilities typically utilize many processing tools to process wafers or wafer lots. The wafers/lots are typically routed from tool to tool based on capacity utilization and other processing considerations. The routes are typically not determined by taking into account processing tool variation that is within specific processing limits.

FIG. 1 shows an example of different types of processing tools 10-13, 20-23, 30-33 and 40-43. In this example, two processing routes R1 and R2 are shown.

In processing route R1, the wafers leaving tool 11 are transferred to tool 21 because tool 21 is either waiting for wafers or has fewer wafers waiting for processing than tools 20, 22 and 23, i.e., the processing route is based on capacity utilization considerations. The wafers leaving tool 21 are transferred to tool 31, and are then transferred from tool 31 to tool 41, for similar reasons, i.e., because tools 31 and 41 are either waiting for wafers or has fewer wafers waiting for processing than, respectively, tools 30, 32 and 33 and tools 40, 42 and 43.

In processing route R2, the wafers leaving tool 12 are similarly transferred to tool 22 because tool 22 is either waiting for wafers or has fewer wafers waiting for processing than tools 20, 21 and 23. The wafers leaving tool 22 are similarly transferred to tool 33 because tool 33 is either waiting for wafers or has fewer wafers waiting for processing than tools 30, 31 and 32, and are then transferred to tool 43 because tool 43 is similarly either waiting for wafers or has fewer wafers waiting for processing than tools 40, 41 and 42.

All processing tools drift with time, e.g., their ability to produce wafers with consistent characteristics and dimensions changes. The tools, however, can be re-centered, i.e., brought back to the point that they produce less variability from wafer to wafer or wafer lot to wafer lot. The need for such re-centering is typically determined by numerous considerations such as, e.g., the tool's maintenance schedule and feedback or measurements provided from monitors, processing results, inspection reports, etc.

The problem, however, is that there is usually a time delay between feedback and tool adjustment. For example, most tools are qualified on a 24 hour or longer interval. A shorter qualification interval is however expensive because it typically requires using more monitors and typically requires the non-productive idling of the tool for qualification and awaiting results thereof.

Awaiting feedback from the wafers is even less effective because the data from the wafers is typically not be available in a timely enough manner. Furthermore, performing excessive readjustment of the tool (even when the tool is in the normal statistical controlled specification limit) can also cause too much interruption of the tool, and may even cause chamber instability.

Accordingly, there exists a need in the art to overcome the deficiencies and limitations described herein.

SUMMARY

In a first aspect of the invention, there is provided a method for increasing overall yield in semiconductor manufacturing comprising routing wafers or wafer lots in a manner which at least partially neutralizes or compensates for processing variation.

In a second aspect of the invention, there is provided a system for increasing overall yield in semiconductor manufacturing comprising a central processing unit (CPU) and a program code for routing wafers or wafer lots from tools of the first type of tools to tools of the second type of tools so as to at least partially neutralizes or compensate for processing variation. The program code is tangibly embodied on medium and processed on the central processing unit.

In a third aspect of the invention, there is provided a method for increasing overall yield in semiconductor manufacturing comprising recording in a database processing data from at least first and second types of tools, comparing the processing data from the tools of the second type of tools to the processing data of at least one tools of the first type of tools, selecting one of the tools of the second type of the tools based, at least in part, on whether it comes closest to neutralizing or compensating for processing variation of the at least one tool of the first type of tools, and routing wafers or wafer lots from the at least one tool of the first type of tools to the selected one of the tools of the second type of tools.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention generally relates to a system and method for increasing overall yield in semiconductor manufacturing by automatically routing the wafers in a manner which neutralizes or compensates for tool processing variations.

According to the invention, processing tools are qualified as usual. However, a real-time database can be created which records and grades each process tool or chamber based on their mean value of the qualification or device measurement result. For example, recorded values for each tool can be +5 or −5 which designate very positively or negatively bias respectively from the target mean. For each processing route, the inter-relationship of all process steps with respect to the individual target mean are evaluated. If the relationship is numerically related, then the wafers are routed to tools such that a positive process bias chamber or tool will be neutralized by a negative process bias chamber tool or vice versa. Furthermore, by obtaining substantially real-time processing data about the tools and/or the wafers or wafer lots, the wafer routing system can be updated as new measurement data is received. The system can also utilize weighting factors in tool pairing as well as a tool pairing algorithm. The system can also take account of new processing data to readjust or update the tool qualification data or results so that the route is determined for the wafers with the latest available processing data for the tools.

Figure 1:
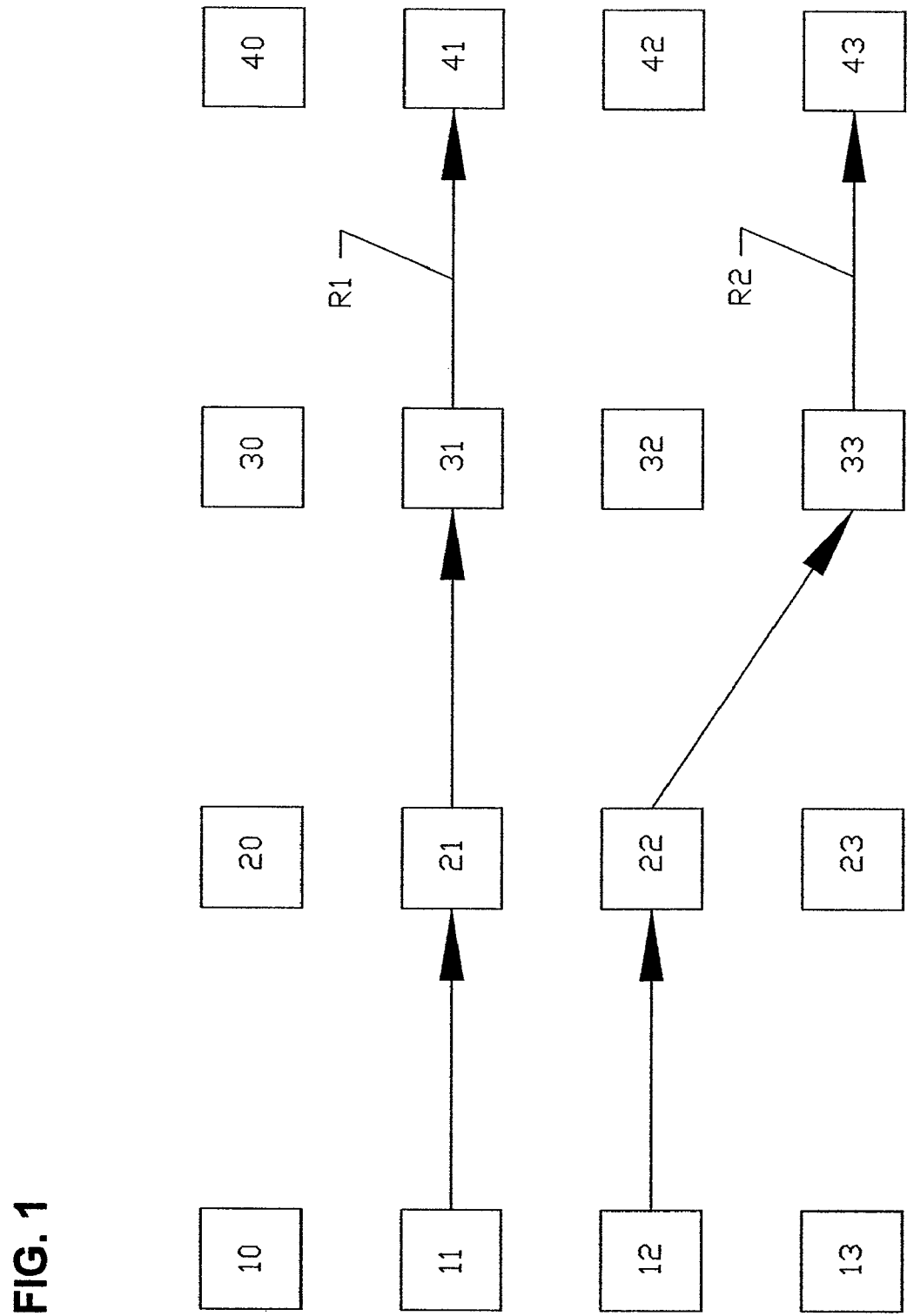
FIG. 1 shows a plurality of different tools and illustrates two routes which wafers or wafer lots can take between the tools.
Figure 2:
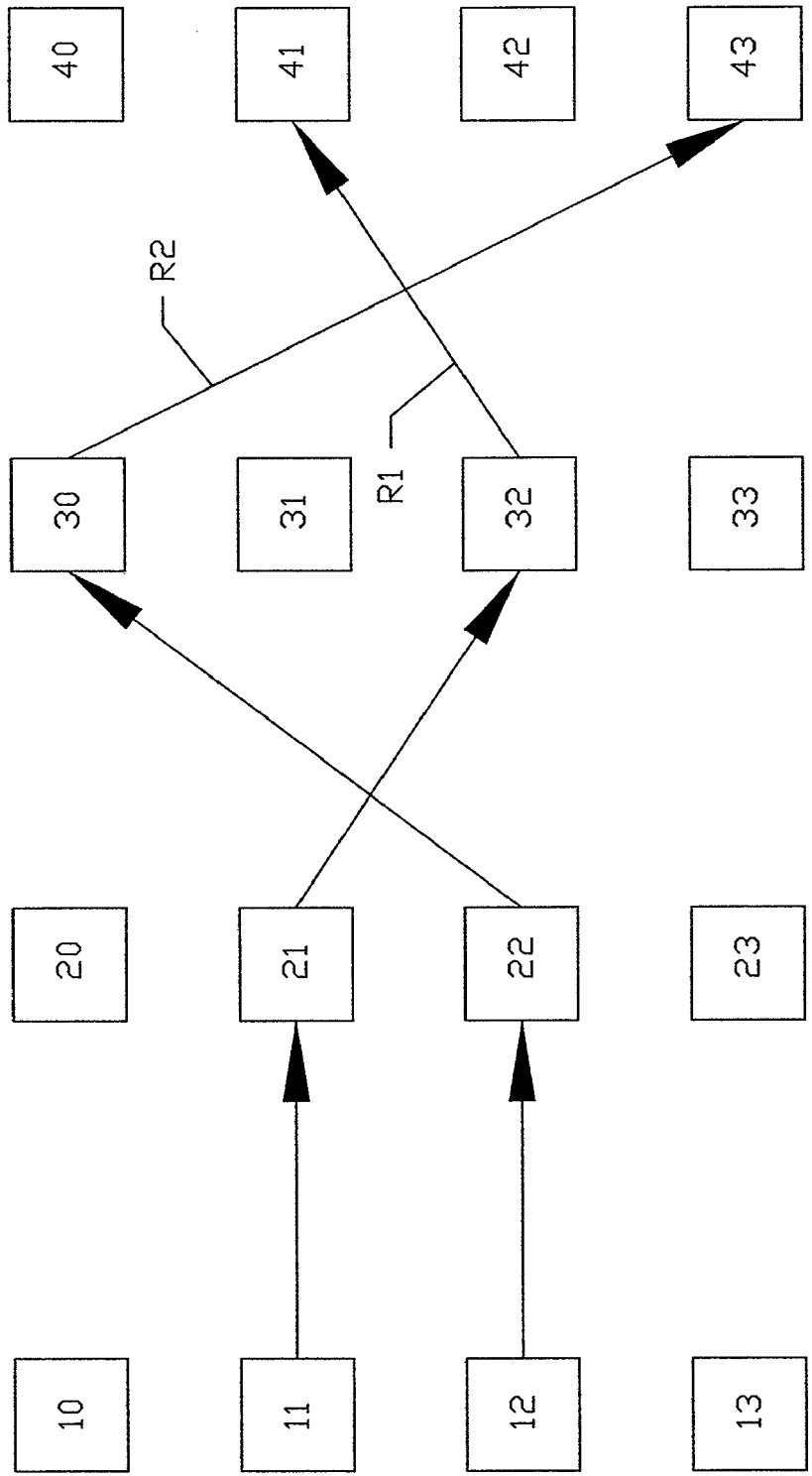
FIG. 2 shows a plurality of different tools and illustrates two exemplary routes which wafers or wafer lots can take between the tools in accordance with the invention.

FIG. 2 shows a non-limiting example of the invention. As was the case in FIG. 1, different types of processing tools 10-13, 20-23, 30-33 and 40-43 utilized. In this example of the invention, only two processing routes R1 and R2 are shown to illustrate the invention. In processing route R1, the wafers leaving tool 11 are transferred to tool 21 because tool 21 is either processing wafers close to nominal (assuming tool 11 is also substantially nominal) or because the tool 21 comes closest to neutralizing or compensating for tool processing variations of tool 11 and is otherwise available. Of course, if tool 21 was down for, e.g., maintenance, the closest (i.e., being best to compensate for previous process variations) other tool of the group 20-23, could be chosen. Furthermore, the determination can also take into account the capacity utilization of the tools 20-23 so that all of the wafers or wafer lots are not mindlessly directed to one or few tools thereby creating a bottleneck.

Again with reference to FIG. 2, the wafers leaving tool 21 are transferred to tool 32, and are then transferred from tool 32 to tool 41, for similar reasons. For example, tool 32 can be selected for the route R1 because tool 32 is either processing wafers close to nominal (assuming tool 21 is also substantially nominal) or because the tool 32 comes closest to neutralizing or compensating for tool processing variations of tool 21 (or possibly also tool 11) and is otherwise available. Furthermore, tool 41 is selected for route R1 because tool 41 is either processing wafers close to nominal (assuming tool 32 is also substantially nominal) or because the tool 41 comes closest to neutralizing or compensating for tool processing variations of tool 32 (or possibly also tools 21 or 11) and is otherwise available. Again, if tools 32 and 41 were down for, e.g., maintenance, the closest other tool of the groups 30-33 and 40-43 could be chosen. Furthermore, capacity utilization can also be taken into account in determining which downstream tools to send the wafers or wafer lots, as long as the determination at least partially takes into account the known process variation(s) of the tools.

In processing route R2, the wafers leaving tool 12 are similarly transferred to tool 22 because tool 22 is either processing wafers close to nominal (assuming tool 12 is also substantially nominal) or because the tool 22 comes closest to neutralizing or compensating for tool processing variations of tool 12 and is otherwise available. Of course, if tool 22 was down for, e.g., maintenance, the closest other tool of the group 20-23, could be chosen. Again, the determination can also take into account the capacity utilization of the tools 20-23 so that all of the wafers or wafer lots are not mindlessly directed to one or few tools thereby creating a bottleneck.

Again with reference to FIG. 2, the wafers leaving tool 22 are transferred to tool 30, and are then transferred from tool 30 to tool 43, for similar reasons. For example, tool 30 can be selected for the route R2 because tool 30 is either processing wafers close to nominal (assuming tool 22 is also substantially nominal) or because the tool 30 comes closest to neutralizing or compensating for tool processing variations of tool 22 (or possibly also tool 12) and is otherwise available. Furthermore, tool 43 is selected for route R2 because tool 43 is either processing wafers close to nominal (assuming tool 30 is also substantially nominal) or because the tool 43 comes closest to neutralizing or compensating for tool processing variations of tool 30 (or possibly also tools 22 or 12) and is otherwise available. Again, if tools 30 and 43 were down for, e.g., maintenance, the closest (i.e., being best to compensate for previous process variations) other tool of the groups 30-33 and 40-43 could be chosen. Again, capacity utilization can also be taken into account in determining which downstream tools to send the wafers or wafer lots, as long as the determination at least partially takes into account the known process variation(s) of the tools.

Figure 3:
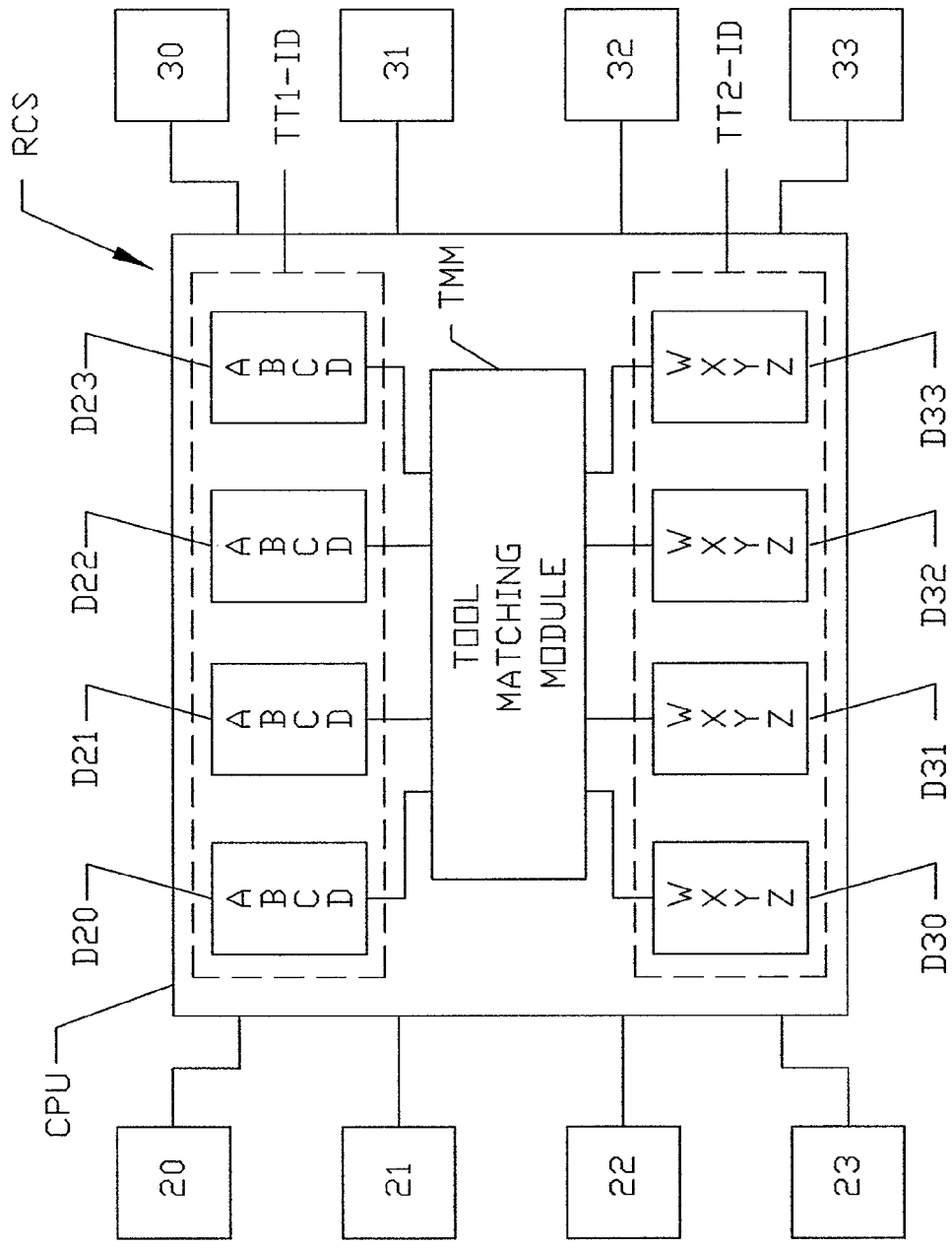
FIG. 3 shows an exemplary route control system in accordance with the invention.

FIG. 3 shows a non-limiting example of a route control system (RCS) in accordance with the invention. The RCS is preferably implemented on hardware (including a central processing unit (CPU)) running software (one or more programs running on the CPU), and includes a plurality of databases D20-D23 which can be organized as a first tool type information database module TT1-ID. Database D20 stores processing data from tool 20, database D21 stores processing data from tool 21, database D22 stores processing data from tool 22, and database D23 stores processing data from tool 23.

The processing data in databases D20-D23 can be represented by letters A-D in FIG. 3 and can correspond to measured or otherwise recorded processing data from each processing tool 20-23. For example, if the tool 20 is a material removing tool, e.g., an etching tool, data A can indicative of the etching value over (−) or under (+) nominal (i.e., a predetermined desired value or range for material removal) for an edge area of the wafers. Data B can indicative of the etching value over (−) or under (+) nominal for a center area of the wafers. Data C can indicative of the etching value over (−) or under (+) nominal for a particular zone area of the wafers. Data D can indicative of the etching value over (−) or under (+) nominal for another different zone area of the wafers.

If, for example, the tool 20 is a material adding tool, e.g., a deposition tool, data A can indicative of the thickness value over (+) or under (−) nominal (i.e., a predetermined desired value or range for material or layer thickness) for an edge area of the wafers. Data B can indicative of the thickness value over (+) or under (−) nominal for a center area of the wafers. Data C can indicative of the thickness value over (+) or under (−) nominal for a particular zone area of the wafers. Data D can indicative of the thickness value over (+) or under (−) nominal for another different zone area of the wafers.

By way further example, data A can indicative of a processing value over (+) or under (−) nominal (i.e., a predetermined desired value or range) for one wafer lot. Data B can indicative of the value or range over (+) or under (−) nominal for another wafer lot. Data C can indicative of the value or range over (+) or under (−) nominal for still another wafer lot. Data D can indicative of the value or range over (+) or under (−) nominal for still another different wafer lot. The data A-D can thus be used to determine by, e.g., averaging, the typical range of variation for each tool 20-23.

Again, with reference to FIG. 3, the system RCS also includes a plurality of databases D30-D33 which can be organized as a second tool type information database module TT2-ID. Database D30 stores processing data from tool 30, database D31 stores processing data from tool 31, database D32 stores processing data from tool 32, and database D33 stores processing data from tool 33.

The processing data of databases D30-D33 can be represented by letters W-Z in FIG. 3 and can correspond to measured or otherwise recorded processing data from each processing tool 30-33, i.e., tools arranged downstream from tools 20-23 and/or tools to which the wafers/lots are transferred from tools 20-23. For example, if the tool 30 is a material removing tool, e.g., an etching tool, data W can indicative of the etching value over (−) or under (+) nominal (i.e., a predetermined desired value or range for material removal) for an edge area of the wafers. Data X can indicative of the etching value over (−) or under (+) nominal for a center area of the wafers. Data Y can indicative of the etching value over (−) or under (+) nominal for a particular zone area of the wafers. Data Z can indicative of the etching value over (−) or under (+) nominal for another different zone area of the wafers.

If, for example, the tool 30 is a material adding tool, e.g., a deposition tool, data W can indicative of the thickness value over (+) or under (−) nominal (i.e., a predetermined desired value or range for material or layer thickness) for an edge area of the wafers. Data X can indicative of the thickness value over (+) or under (−) nominal for a center area of the wafers. Data Y can indicative of the thickness value over (+) or under (−) nominal for a particular zone area of the wafers. Data Z can indicative of the thickness value over (+) or under (−) nominal for another different zone area of the wafers.

By way further example, data W can indicative of a processing value over (+) or under (−) nominal (i.e., a predetermined desired value or range) for one wafer lot. Data X can indicative of the value or range over (+) or under (−) nominal for another wafer lot. Data Y can indicative of the value or range over (+) or under (−) nominal for still another wafer lot. Data Z can indicative of the value or range over (+) or under (−) nominal for still another different wafer lot. The data W-Z can thus be used to determine by, e.g., averaging, the typical range of variation for each tool 30-33.

Again, with reference to FIG. 3, the system RCS also includes a tool matching module (TMM) which can match downstream tools to upstream tools based on yield or processing data and/or match wafers or wafer lots to downstream tools based on yield or processing data. The TMM can accesses the data A-D from the database module for the tools 20-23 and the data W-Z from the database module for the tools 30-33 (as well as data from tools 10-13 and 40-43 in FIG. 2, and preferably including data from all processing tools). The module TMM can perform a number of functions with the data. For example, the module TMM can compare the processing data from the tools 30-33 to the processing data of one or more of the tools 20-23, e.g., tool 22 in FIG. 2, and select one of the tools 30-33, e.g., tool 30 in FIG. 2, based, at least in part, on whether it comes closest to neutralizing or compensating for tool processing variation of the tool 22. This information can then be used to route wafers or wafer lots from tool 22 to tool 30 (see FIG. 2).

An example of using the system of FIG. 3 to determine the route to take in FIG. 2 will now be explained. Assume that tools 20-23 are etching tools and that tool 22 is an etching tool that is etching too much material from a wafer edge such that the value for data A in database D22 is −5 (i.e., 5 units of more etching compared to the nominal desired value of 0). Assume also that tools 30-33 are deposition tools, and that; tool 30 is adding too much material to a wafer edge such that the value for data W in database D30 is +5 (i.e., 5 units of more thickness compared to the nominal value of 0); tool 31 is adding just the right amount of material to a wafer edge such that the value for data W in database D32 is nominal (0); tool 32 is adding too little material to a wafer edge such that the value for data W in database D32 is −5 (i.e., 5 units of less thickness compared to the nominal value of 0); and tool 33 is adding too little material to a wafer edge such that the value for data W in database D33 is −2 (i.e., 2 units of less thickness compared to the nominal value of 0). In this case, the module TMM would determine that the wafers or wafer lots from tool 22 should be routed to tool 30 because the over etching value of −5 would be essentially neutralized or compensated for by the over deposition value of +5 of tool 30. Of course, this determination would me made for wafers or wafer lots leaving each of the tools 20-23 to determine which of the tools 30-33 to send the wafers or wafer lots.

Figure 4:
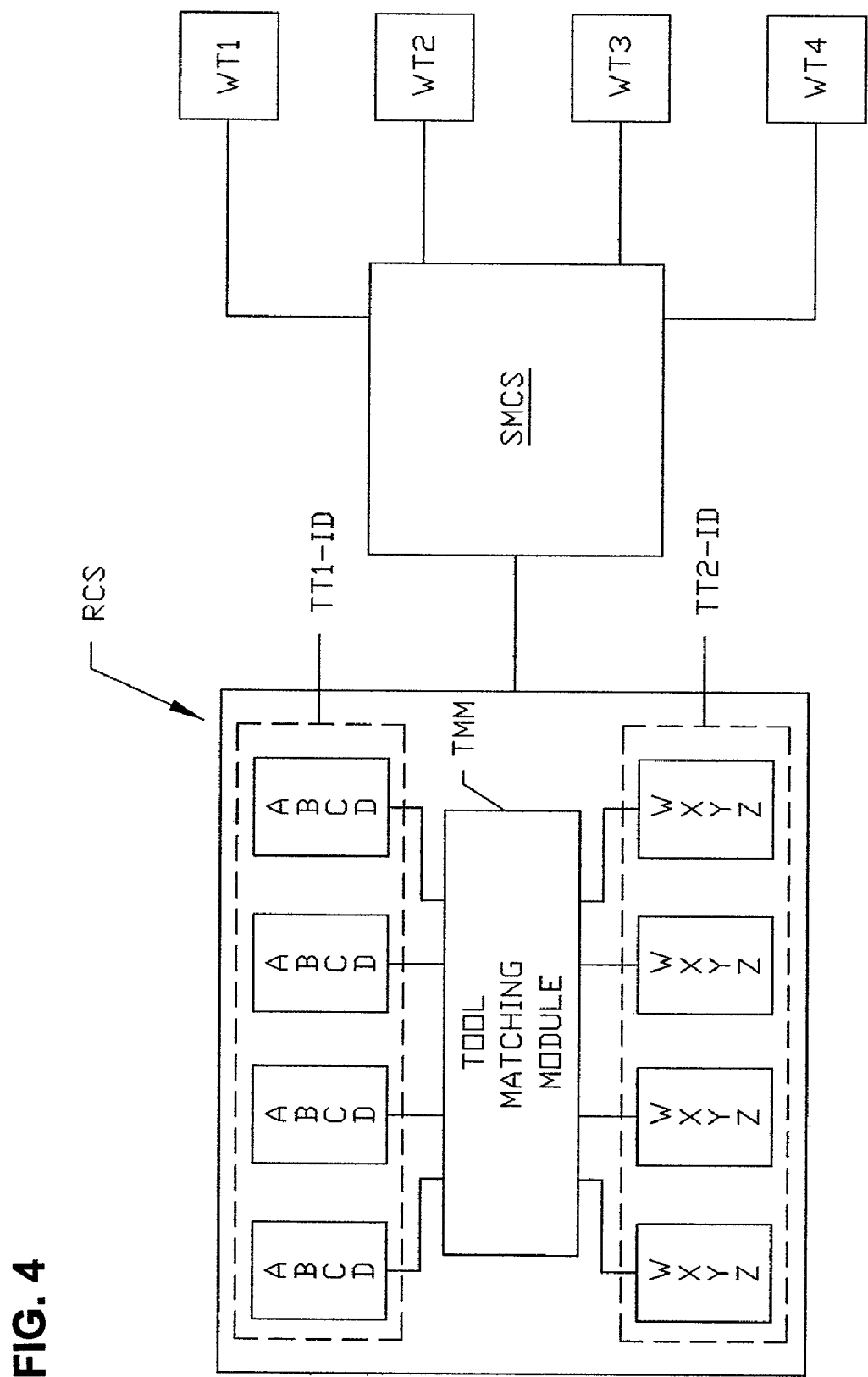
FIG. 4 shows an exemplary semiconductor manufacturing computer system in communication with the route control system and a plurality of wafer transporting devices.

FIG. 4 shows a non-limiting example of the route control system RCS being in communication with and/or electrically connected to the semiconductor manufacturing control system SMCS. This allows the routing information obtained by the system RCS to be used by the system SMCS to control each of the wafer transport devices WT1-WT4 so that the wafers or lots can be routed automatically and in a seamless manner under the overall control of the system SMCS. By way of non-limiting example, the transport devices WT1-WT4 can transport the wafers or wafer lots between the tools 10-13 and tools 40-43 via routes R1 and R2 (see FIG. 3).

Figure 5:
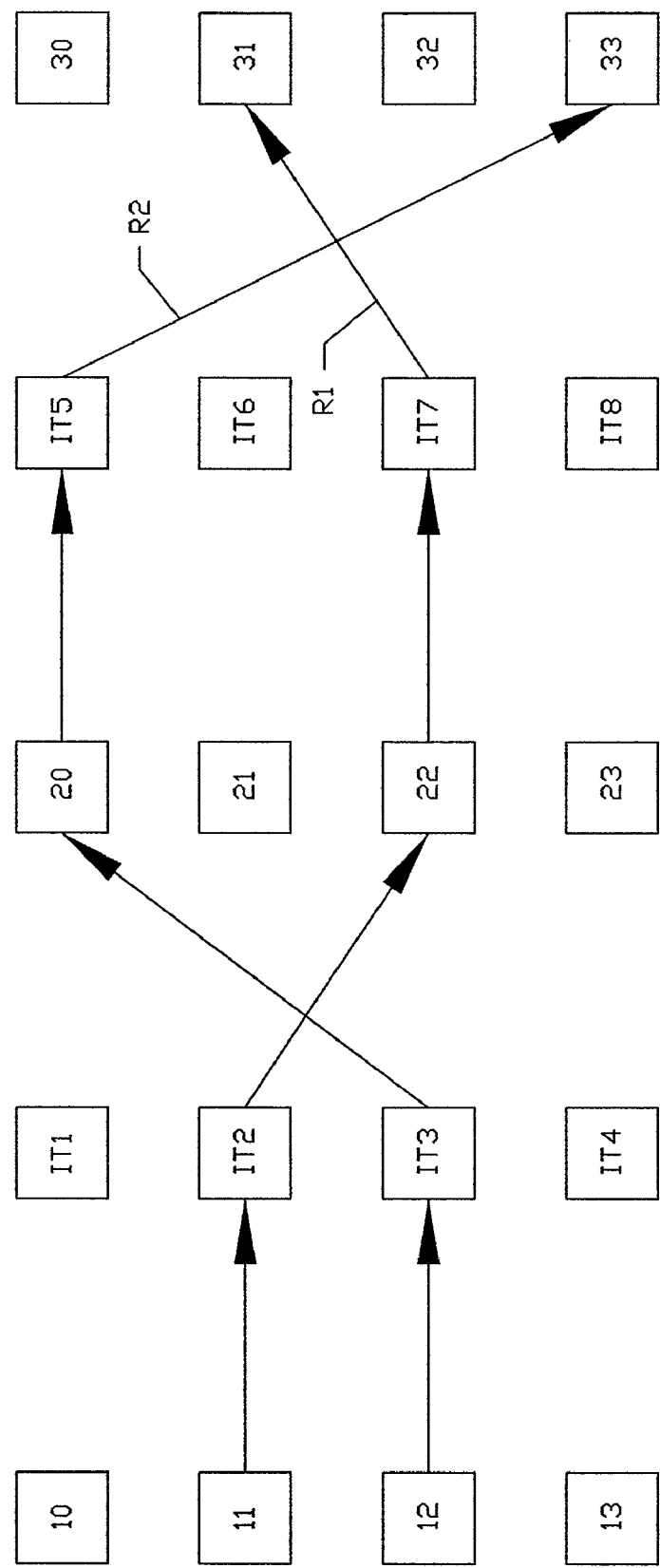
FIG. 5 shows a plurality of different tools and testing/measurement stations, and illustrates two exemplary routes which wafers or wafer lots can take between the tools and testing/measurement stations in accordance with the invention.

FIG. 5 shows another non-limiting example of the invention. As was the case in FIG. 2, different types of processing tools 10-13, 20-23 and 30-33 are utilized. However, in this embodiment, first and second measuring/testing stations IT1-IT4 and IT5-IT8 are utilized to obtain processing data between processing toots. In this example of the invention, only two processing routes R1 and R2 are shown to illustrate the invention. In processing route R1, the wafers leaving tool 11 are transferred to station IT2 to obtain real-time data for tools 10-13 from the wafers or wafer lots leaving the tools 10-13. This data is then utilized to determine which tool, e.g., tool 22, to transfer the wafers to in a manner similar to that described above with regard to FIGS. 2 and 3. Since the stations IT1-IT4 do not process the wafers or wafer lots, routing to these stations from tools 10-13 can take place based on capacity utilization. Similarly, the wafers leaving tool 22 are transferred to station IT7 to obtain real-time data for tools 20-23 from the wafers or wafer lots leaving the tools 20-23. This data is then utilized to determine which tool, e.g., tool 31, to transfer the wafers to in a manner similar to that described above with regard to FIGS. 2 and 3. Since the stations IT5-IT8 do not process the wafers or wafer lots, routing to these stations from tools 20-23 can take place based on capacity utilization. Route R2 would take place in a similar manner with the wafers or wafer lots being transferred from tool 12, to station IT3 based on capacity, then to tool 20 based on neutralizing or compensating for tool processing variation of tool 12, then to station IT5 based on capacity, and then to tool 33 based on neutralizing or compensating for tool processing variation of tool 20.

Figure 6:
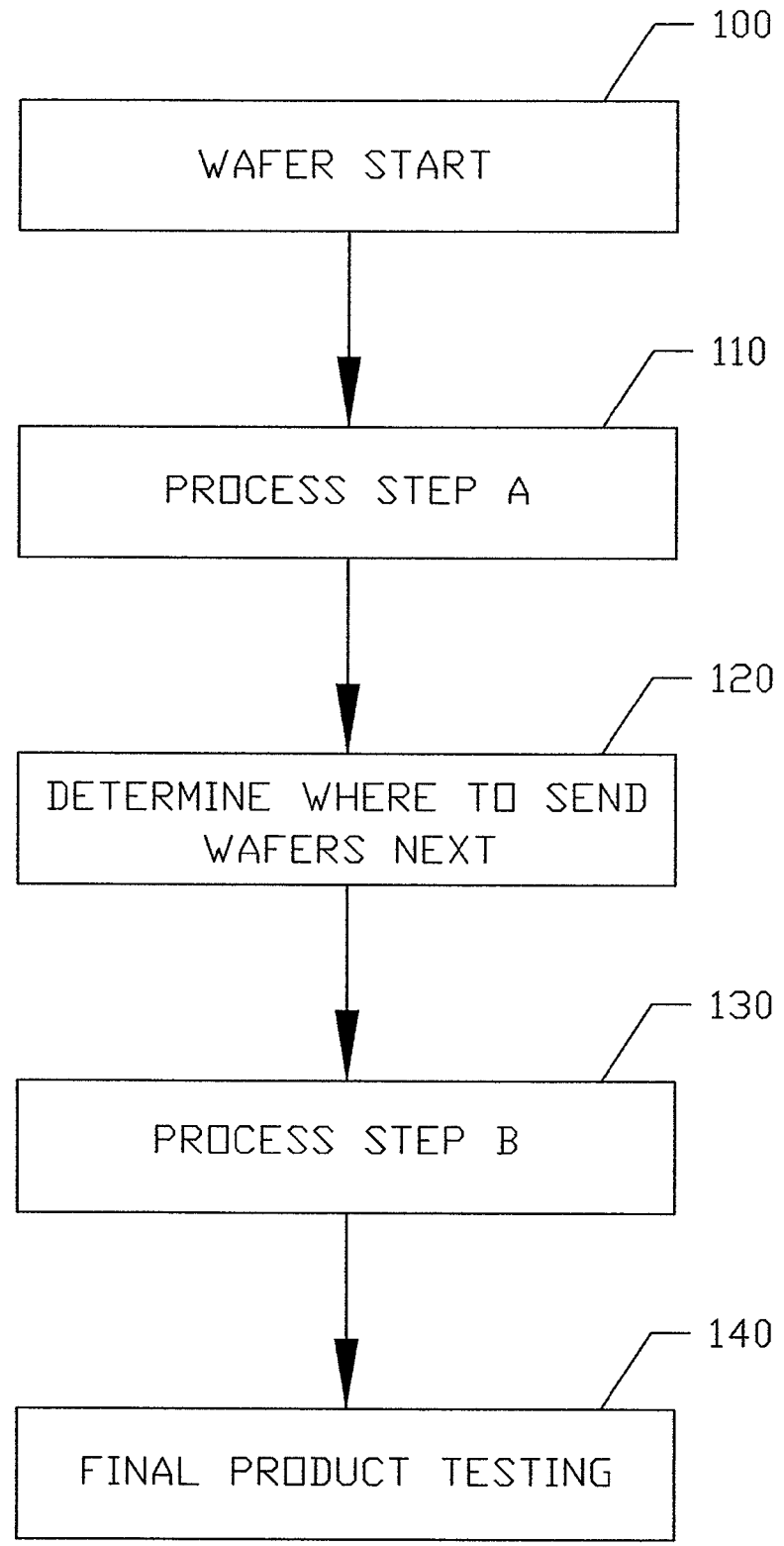
FIG. 6 shows a non-limiting process of routing the wafers or wafer lots in accordance with the invention.
Figure 8:
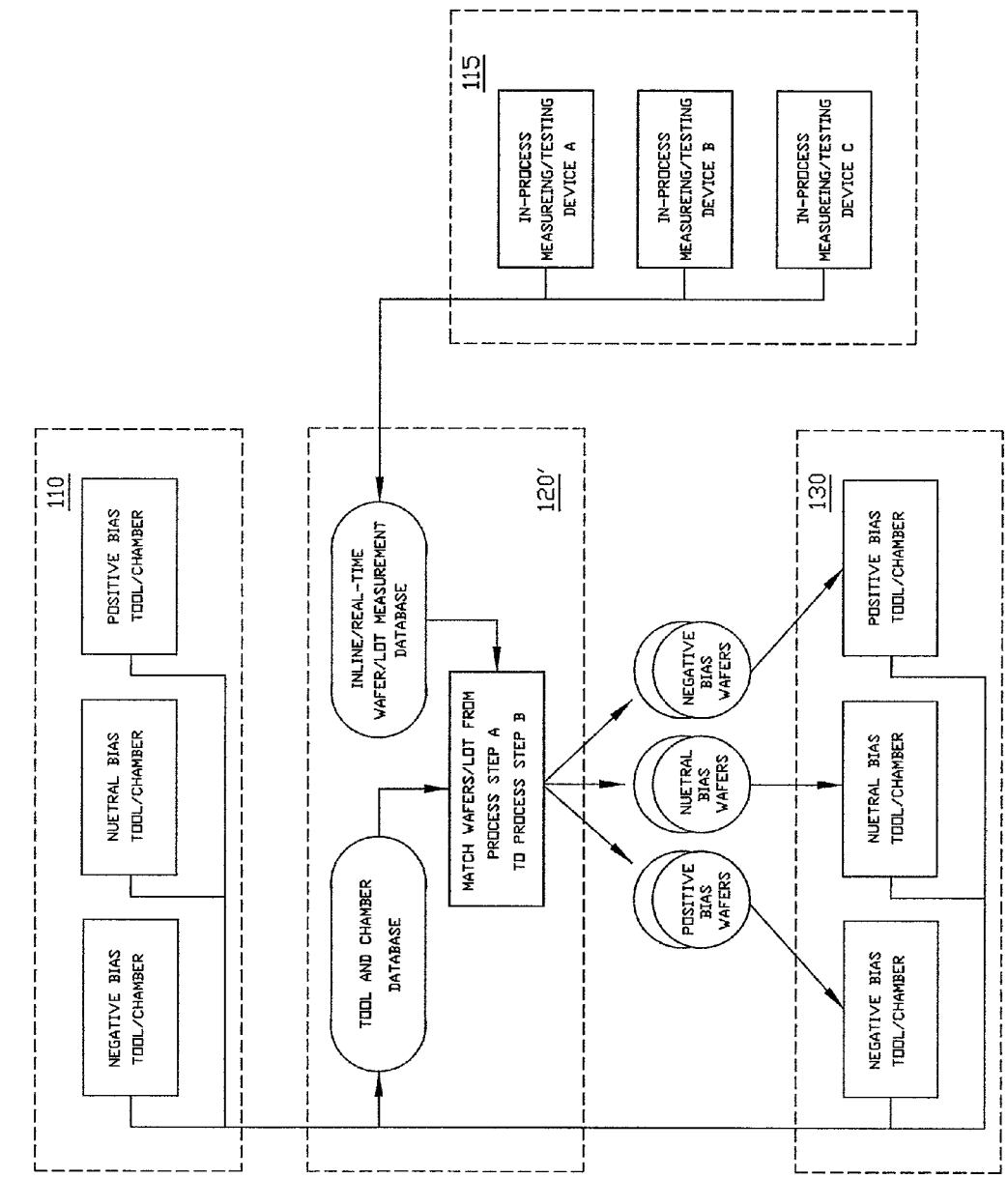
FIG. 8 shows another information system which can be utilized to determine the wafer processing route in accordance with the invention.
Figure 9:
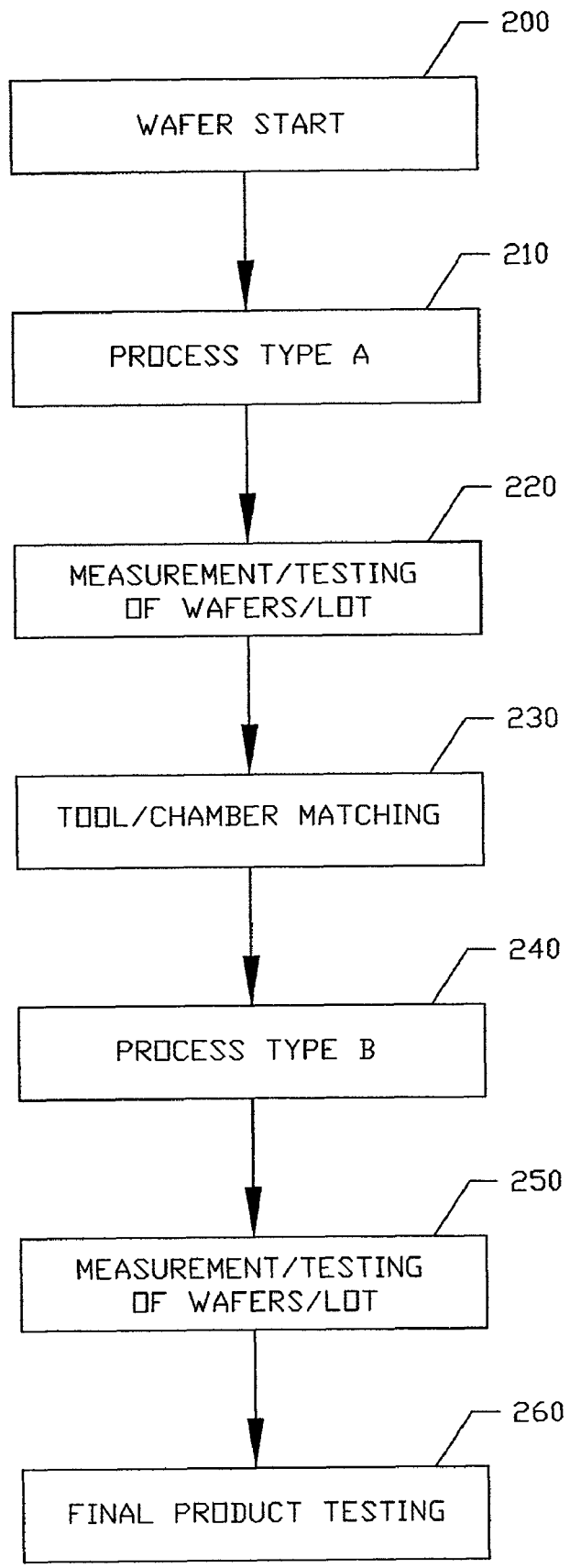
FIG. 9 shows another non-limiting process of routing the wafers or wafer lots in accordance with the invention.

FIGS. 6 and 9 show flow diagrams implementing aspects of the invention. The steps of the flow diagrams described herein may be implemented in the environment of FIGS. 1-5, 7, 8, 10 and 11. The flow diagrams may equally represent a high-level block diagram of the invention. The steps of the flow diagram may be implemented and executed from a server, in a client-server relationship, by computing devices in an ad hoc network, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. The software and/or computer program product can be implemented in the environments of FIGS. 1-5, 7, 8, 10 and 11. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

FIG. 6 shows a non-limiting process of routing wafers or wafer lots in accordance with the invention. In step 100, the wafers or wafer lots are made ready for processing in a semiconductor manufacturing facility. Next, in step 110, wafers or wafer lots are processed in a first type of tools and subjected to process A which can be any type of wafer process such as etching, deposition, etc. Next, in step 120, a determination is made where to send or transfer the wafers or wafer lots leaving the tools implementing process A. During this stage, the system shown in FIGS. 3 and/or 4 as well as FIGS. 7 and/or 8 can be utilized. Next, in step 130, the wafers or wafer lots are transferred, based on step 120, to the second type of tools implementing process B. Once the wafers or wafer lots are processed, they are subject to final testing in step 140 where they preferably have increasing overall yield because the wafers were automatically routed in a manner which neutralizes or compensates for tool processing variations.

Figure 7:
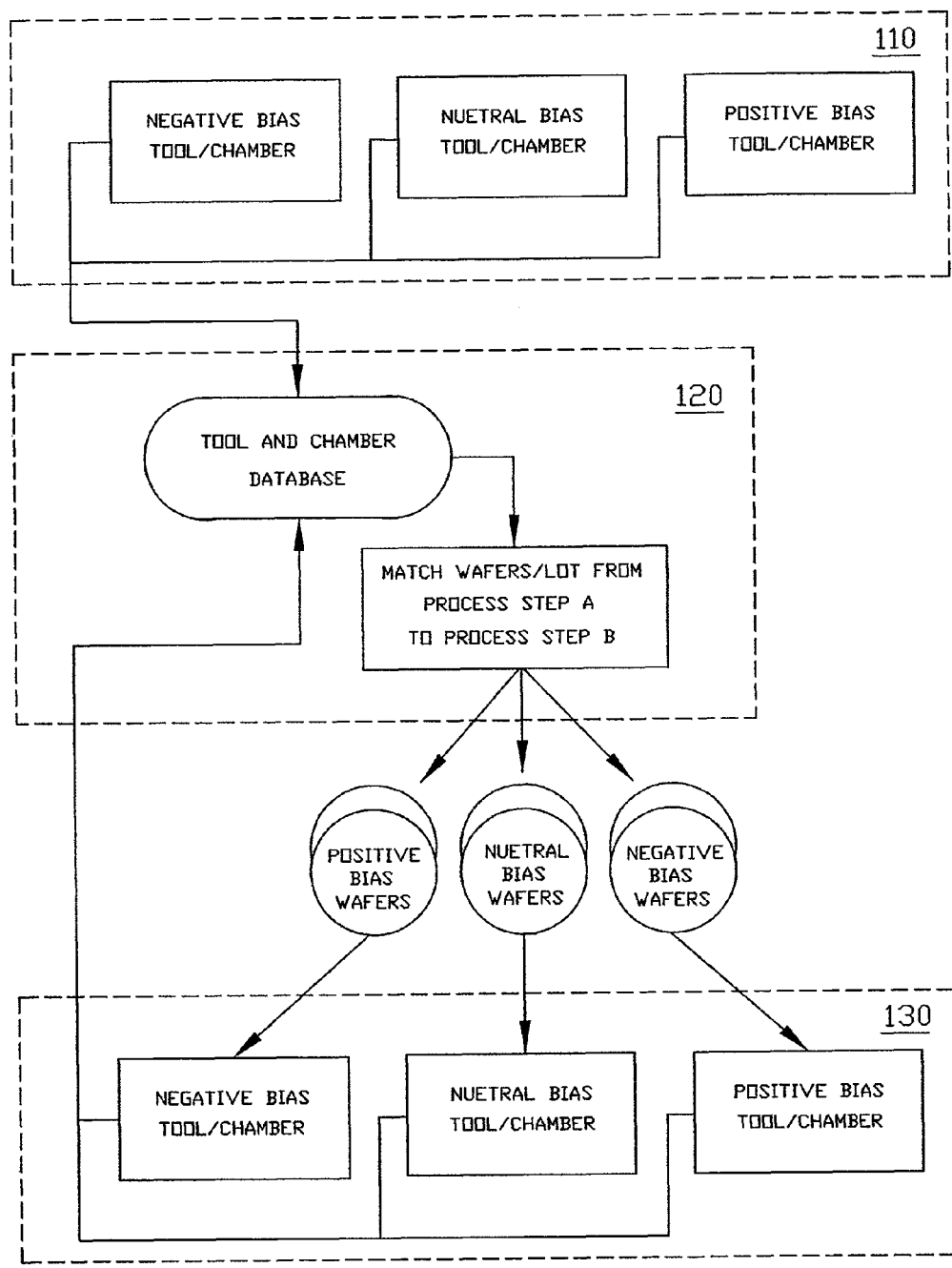
FIG. 7 shows an information system which can be utilized to determine the wafer processing route in accordance with the invention.

FIG. 7 illustrates in detail three process steps of FIG. 6 and shows three exemplary upstream processing tools in step 110 of FIG. 6 which are respectively producing a negative bias, a neutral bias, and a positive bias. If the tools of process A are etching tools, negative bias means the tool is not etching sufficiently based on the desired nominal value, neutral bias means the tool is etching sufficiently based on the desired nominal value, and positive bias means the tool is etching too much based on the desired nominal value. In step 130, information from downstream processing tools from FIG. 6 which are producing a negative bias, a neutral bias, and a positive bias. If the tools of process B are deposition tools, negative bias means the tool is not adding sufficient material based on the desired nominal value, neutral bias means the tool is adding sufficient material based on the desired nominal value, and positive bias means the tool is adding too much material based on the desired nominal value. In step 120, information from the three tools of step 110 and from the three tools in step 130 is supplied to a tool and chamber database. This information is used to match wafers from the tools of process A to the tools of process B. The wafers or wafer lots are matched as follows; from the tool of step 110 having a negative bias to the tool of step 130 having a positive bias, from the tool of step 110 having a neutral bias to the tool of step 130 having a neutral bias, and from the tool of step 110 having a positive bias to the tool of step 130 having a negative bias. In this way, the overall yield of the wafers will increase because the wafers are automatically routed in a manner which neutralizes or compensates for tool processing variations.

FIG. 8 illustrates in detail a modified version of three process steps of FIG. 6 and shows three exemplary upstream processing tools in step 110 of FIG. 6 which are respectively producing a negative bias, a neutral bias, and a positive bias. If the tools of process A are etching tools, negative bias means the tool is not etching sufficiently based on the desired nominal value, neutral bias means the tool is etching sufficiently based on the desired nominal value, and positive bias means the tool is etching too much based on the desired nominal value. In step 130, information from downstream processing tools from FIG. 6 which are producing a negative bias, a neutral bias, and a positive bias. If the tools of process B are deposition tools, negative bias means the tool is not adding sufficient material based on the desired nominal value, neutral bias means the tool is adding sufficient material based on the desired nominal value, and positive bias means the tool is adding too much material based on the desired nominal value. In step 120, information from the three tools of step 110 and from the three tools in step 130 is supplied to a tool and chamber database. Additionally, information from the three in-process measuring stations or devices A-C from step 115 is supplied to an inline/real-time wafer/lot measurement database. The information from these databases is used to match wafers from the tools of process A to the tools of process B in step 120'. The wafers or wafer lots are matched as follows; from the tool of step 110 having a negative bias to the tool of step 130 having a positive bias, from the tool of step 110 having a neutral bias to the tool of step 130 having a neutral bias, and from the tool of step 110 having a positive bias to the tool of step 130 having a negative bias. In this way, the overall yield of the wafers will increase because the wafers are automatically routed in a manner which neutralizes or compensates for tool processing variations.

FIG. 9 shows another non-limiting process of routing wafers or wafer lots in accordance with the invention. In step 200, the wafers or wafer lots are made ready for processing in a semiconductor manufacturing facility. Next, in step 210, wafers or wafer lots are processed in a first type of tools and subjected to process A which can be any type of wafer process such as etching, deposition, etc. In step 220, information from in-process measuring stations or devices is obtained from the wafers or wafer lots after step 210, and is supplied to an inline/real-time wafer/lot measurement database. Next, in step 230, a determination is made where to send or transfer the wafers or wafer lots leaving the tools implementing process A by matching wafers from the tools of process A to the tools of process B. During this stage, the system shown in FIGS. 3 and/or 4 as well as FIGS. 10 and/or 11 can be utilized. Next, in step 240, the wafers or wafer lots are transferred, based on step 230, to the second type of tools implementing process B. In step 250, information from in-process measuring stations or devices is obtained from the wafers or wafer lots after step 240, and is supplied to an inline/real-time wafer/lot measurement database. Additional processing can then occur similar to steps 210-240. Once the wafers or wafer lots are processed, they are subject to final testing in step 260 where they preferably have increasing overall yield because the wafers were automatically routed in a manner which neutralizes or compensates for tool processing variations.

Figure 10:
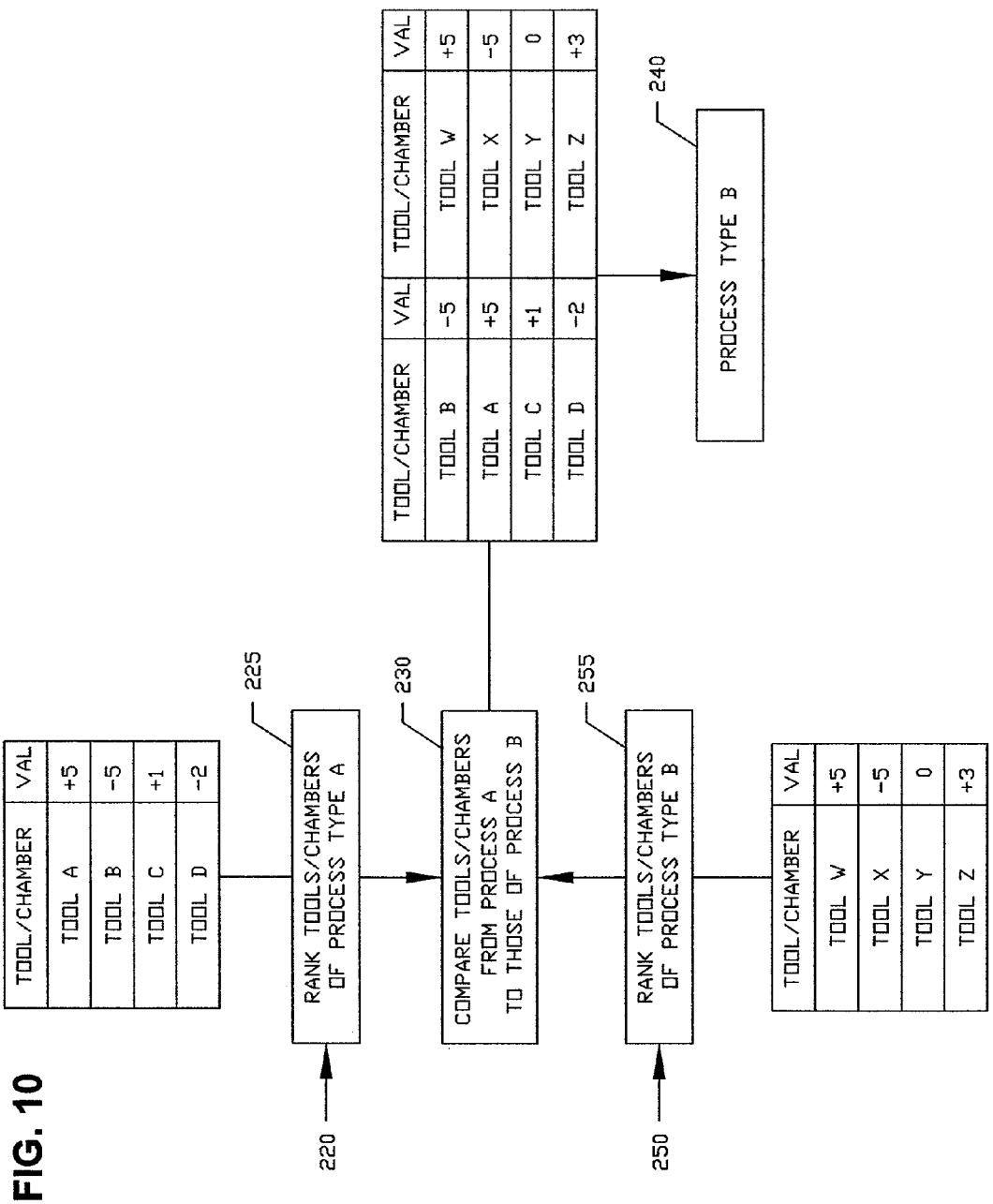
FIG. 10 shows another information system which can be utilized to determine the wafer processing route in accordance with the invention.

FIG. 10 illustrates in detail process steps 220-250 of FIG. 9. This figure shows how the exemplary upstream processing data obtained in step 220 of FIG. 9 is organized in a database which records values for tools A-D respectively as +5, -5, +1 and -2 and how the exemplary downstream processing data obtained in step 250 of FIG. 9 is organized in a database which records values for tools W-Z respectively as +5, -5, 0 and +3. In step 230, information from both the upstream and downstream processing tool databases is compared from process A to that of process B. This information is used to match wafers from the tools of process A to the tools of process B for step 240. The wafers or wafer lots are matched as follows; wafers from tool B are routed to tool W because when values -5 and +5 are matched, the result of the process A and B will be made nominal, wafers from tool A are routed to tool X because when values -5 and +5 are matched, the result of the process A and B will be made nominal, wafers from tool C are routed to tool Y because when values +1 and 0 are matched, the result of the process A and B will be made close to nominal, and wafers from tool D are routed to tool Z because when values -2 and +3 are matched, the result of the process A and B will be made close to nominal. In this way, the overall yield of the wafers will increase because the wafers are automatically routed in a manner which neutralizes or compensates for tool processing variations.

Figure 11:
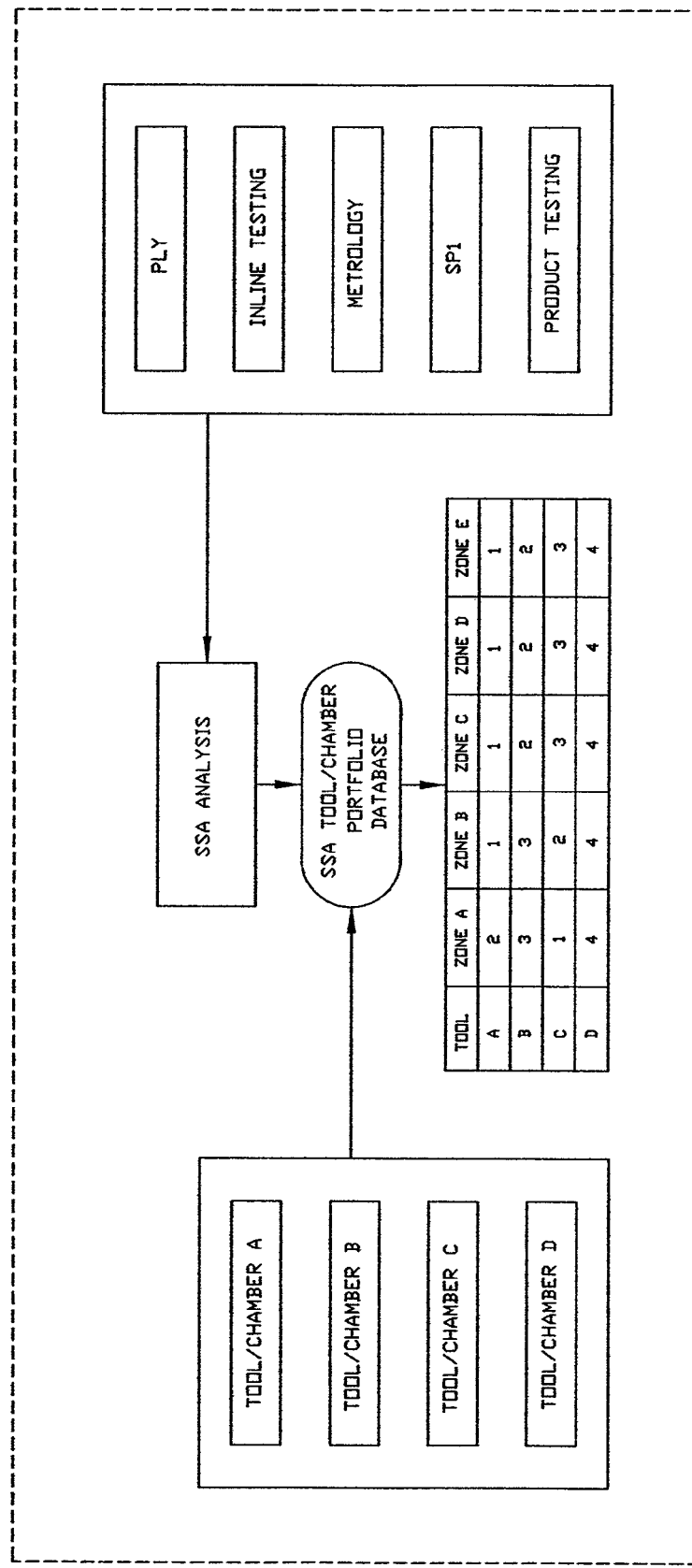
FIG. 11 shows still another information system which can be utilized to determine the wafer processing route in accordance with the invention.

FIG. 11 illustrates an optional system configuration which can be utilized in accordance with the invention. The system can utilize a spatial signature analysis database which stores tool processing data from tools A-D for various zones of a wafer and which stores tool processing data from the zones of the wafers or wafer lots processed by the tools A-D. Such data can include photo-limited yield (PLL) data, surface particle measurement (SP1) data, etc. Before this latter data is stored, it can be analyzed by a spatial signature analysis system. The database can then organize the data from the tools A-D and the wafers processed by the tools A-D and generate a table which describes what happens to the various zones of the wafers in tools A-D. This information can then be used in the processes of, e.g., FIGS. 6 and 9, to match wafers from the tools of process A to the tools of process B. In this way, the overall yield of the wafers by zone will increase because the wafers are automatically routed in a manner which neutralizes or compensates for tool processing variations.

By way of other non-limiting example, the invention can also be advantageous for the following process steps; pairing up a litho dose step with a reactive ion etching (RIE) step so that the final dimensions are compensated for after etching. Thus, for example, a higher photo dose can be utilized to produce a slightly higher development dimension of the photomask in order to compensate for an RIE step utilizing a lower etch bias.

The invention can be particular advantageous in semiconductor manufacturing, particularly at the 65 nm technology node and beyond where AMC is projected by the 2007 International Technology Roadmap for Semiconductors (ITRS) to be a potential yield limiter. Any manufacturing process where process queue times result in product degradation to exposure to uncontrolled environment can also benefit from the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method for increasing overall yield in semiconductor manufacturing comprising:

processing wafers or wafer lots with a first tool from a first group of tools;

recording process variation data for each tool of the first group of tools;

recording process variation data for each tool of a second group of tools;

comparing the recorded process variation data for the first tool to the recorded process variation data for each tool of the second group of tools;

determining a second tool from the second group of tools that at least partially neutralizes or compensates for the recorded process variation for the first tool;

routing the wafers or wafer lots from the first tool to the determined second tool after processing the wafers or wafer lots with the first tool based on the comparing the recorded process variation for the first tool to the recorded process variation data for each tool of the second group of tools; and updating the routing as new process variation data is received, wherein:

the first group of tools is a plurality of upstream tools and the second group of tools is a plurality of downstream tools;

the determining where to send the wafers or wafer lots comprises:

comparing process variation data for the plurality of upstream tools to process variation data for the plurality of downstream tools;

selecting one of the tools of the plurality of downstream tools based, at least in part, on whether the one of the tools comes closest to neutralizing or compensating for processing variation of at least one tool of the plurality of upstream tools; and the wafers or wafer lots are routed to the selected one of the tools of the plurality of downstream tools based on the determination; and the recording comprises grading based on a mean value of a qualification or device measurement result.

2. The method of claim 1, wherein:
the process variation data for tools is recorded in a database in real-time; and
the determining is based on information recorded in the database.

3. The method of claim 1, wherein:
process variation data for all usable tools is recorded in a database in real-time; and
the determining is based on information recorded in the database.

4. The method of claim 1, wherein:
the comparing comprises comparing process variation data of each of the plurality of downstream tools to processing variation data for at least one of the plurality of upstream tools; and
the routing of the wafers or wafer lots is to the selected one of the plurality of downstream tools based on the comparing.

5. The method of claim 1, wherein:
the comparing comprises comparing real-time process variation data of each of the plurality of downstream tools to the process variation data for the plurality of upstream tools; and
the routing of the wafers or wafer lots is to the selected one of the plurality of downstream tools based on the comparing.

6. The method of claim 1, wherein:
the comparing comprises:
comparing process variation data of each of the plurality of downstream tools to process variation data for at least one of the plurality of upstream tools; and
selecting the one of the one of the plurality of downstream tools based on the comparing; and
the routing of the wafers or wafer lots is to the selected one of the plurality of downstream tools based on the selecting.

7. The method of claim 1, wherein
the routing of the wafers or wafer lots is from at least one tool producing at least one process variation that is greater than a desired processing value or range to another tool producing at least one process variation that is lesser than a desired processing value or range.

8. The method of claim 1, wherein
the routing of the wafers or wafer lots is from at least one tool which removes more material than is desired or required to a tool which adds more material than is desired or required.

9. The method of claim 1, wherein at least one of:
the routing of the wafers or wafer lots is from at least one etching tool which is determined to remove more material than is desired or required to a deposition tool which is determined to add more material than is desired or required; and
the routing of the wafers or wafer lots is from at least one tool which adds more material than is desired or required to a tool which removes more material than is desired or required.

10. The method of claim 1, wherein
the routing of the wafers or wafer lots is from at least one deposition tool which is determined to add more material than is desired or required to an etching tool which is determined to remove more material than is desired or required.

11. The method of claim 1, wherein:
process variation data for tools is recorded in a database; and
at least one of:
the routing of the wafers or wafer lots is from at least one tool producing at least one processing variation that is greater than a desired processing value or range to another tool producing at least one processing variation that is lesser than a desired processing value or range; and
the routing of the wafers or wafer lots is from at least one tool producing at least one processing variation that is lesser than a desired processing value or range to another tool producing at least one processing variation that is greater than a desired processing value or range.

12. The method of claim 1, wherein the process variation data from the plurality of upstream and downstream tools is recorded in a database in real-time.

13. A system for increasing overall yield in semiconductor manufacturing comprising:
a central processing unit (CPU); and
program code for:
recording process variation data for tools during processing of wafers or wafer lots, the tools comprising a first type of tools and a second type of tools;
comparing the recorded process variation data for the first type of tools to that of the second type of tools;
determining where to send the wafers or wafer lots based on the recording in a manner which at least partially neutralizes or compensates for processing variation;
routing the wafers or wafer lots from tools of the first type of tools to tools of the second type of tools based on the comparing; and
updating the routing as new process variation data is received,
wherein:
the program code is tangibly embodied on memory and processed on the central processing unit;
the first type of tools is a plurality of upstream tools and the second type of tools is a plurality of downstream tools;
the determining where to send the wafers or wafer lots comprises:
comparing process variation data for the plurality of upstream tools to process variation data for the plurality of downstream tools;
selecting one of the tools of the plurality of downstream tools based, at least in part, on whether the one of the tools comes closest to neutralizing or compensating for processing variation of at least one tool of the plurality of upstream tools; and
the wafers or wafer lots are routed to the selected one of the tools of the plurality of downstream tools based on the determination; and
the recording comprises grading based on a mean value of a qualification or device measurement result.

14. The system of claim 13, further comprising at least one of:
wherein the system is structured and arranged to route the wafers or wafer lots from at least one etching tool which is determined to remove more material than is desired or required to a deposition tool which is determined to add more material than is desired or required; and wherein the system is structured and arranged to route the wafers or wafer lots from at least one tool which adds more material than is desired or required to a tool which removes more material than is desired or required.

15. A method for increasing overall yield in semiconductor manufacturing comprising:

recording in a database processing data from at least first and second types of tools during processing of wafers or wafer lots;

comparing the processing data from the tools of the second type of tools to the processing data of at least one tools of the first type of tools;

selecting one of the tools of the second type of the tools based, at least in part, on whether it comes closest to neutralizing or compensating for processing variation of the at least one tool of the first type of tools;

routing the wafers or wafer lots from the at least one tool of the first type of tools to the selected one of the tools of the second type of tools based on the comparing; and updating the routing as new process variation data is received.

wherein:

the first and second types of tools comprise a plurality of upstream tools and a plurality of downstream tools respectively;

the comparing comprises comparing process variation data for the plurality of upstream tools to process variation data for the plurality of downstream tools;

the selecting comprises selecting one of the tools of the plurality of downstream tools based, at least in part, on whether the one of the tools comes closest to neutralizing or compensating for processing variation of at least one tool of the plurality of upstream tools;

the wafers or wafer lots are routed to the selected one of the tools of the plurality of downstream tools based on the comparing; and the recording comprises grading based on a mean value of a qualification or device measurement result.

16. The method of claim 15, further comprising at least one of:

transferring the wafers or wafer lots from at least one etching tool which is determined to remove more material than is desired or required to a deposition tool which is determined to add more material than is desired or required; and transferring the wafers or wafer lots from at least one tool which adds more material than is desired or required to a tool which removes more material than is desired or required.

* * * * *